US012604494B2

(12) United States Patent
Smith et al.

(10) Patent No.: US 12,604,494 B2
(45) Date of Patent: Apr. 14, 2026

(54) GATE END CAP AND BOUNDARY PLACEMENT IN TRANSISTOR STRUCTURES FOR N-METAL OXIDE SEMICONDUCTOR (N-MOS) PERFORMANCE TUNING

(71) Applicant: Intel Corporation, Santa Clara, CA (US)

(72) Inventors: Andrew Smith, Hillsboro, OR (US); Brian Greene, Portland, OR (US); Seonghyun Paik, Hillsboro, OR (US); Omair Saadat, Portland, OR (US); Chung-Hsun Lin, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 971 days.

(21) Appl. No.: 17/470,993

(22) Filed: Sep. 9, 2021

(65) Prior Publication Data

US 2023/0071699 A1    Mar. 9, 2023

(51) Int. Cl.
H01L 29/423 (2006.01)
H01L 27/092 (2006.01)
(Continued)

(52) U.S. Cl.
CPC ..... H10D 30/6735 (2025.01); H10D 30/6757 (2025.01); H10D 62/118 (2025.01);
(Continued)

(58) Field of Classification Search
None
See application file for complete search history.

(56) References Cited

U.S. PATENT DOCUMENTS

2016/0365341 A1 * 12/2016 Then ...................... H10D 84/01
2019/0088798 A1    3/2019 Kim et al.
(Continued)

FOREIGN PATENT DOCUMENTS

CN        113053823        6/2021
EP          3588545        1/2020
WO      2016137589        9/2016

OTHER PUBLICATIONS

Extended European Search Report from European Patent Application No. 22183332.0 notified Jan. 4, 2023, 13 pgs.
(Continued)

*Primary Examiner* — Walter H Swanson
(74) *Attorney, Agent, or Firm* — Essential Patents Group, LLP

(57) ABSTRACT

A transistor structure includes a channel region including first sidewall. A gate electrode includes a first layer having a first portion adjacent to the first sidewall and a second portion adjacent to a gate electrode boundary sidewall. The gate electrode includes a second layer between the first and second portions of the first layer. The first layer has a first composition associated with a first work function material, and has a first lateral thickness from the first sidewall. The second layer has a second composition associated with a second work function material. Depending one a second lateral thickness of the second layer, the second layer may modulate a threshold voltage ($V_T$) of the transistor structure by more or less. In some embodiments, a ratio of the second lateral thickness to the first lateral thickness is less than three.

9 Claims, 14 Drawing Sheets

(51) Int. Cl.

| | | |
|---|---|---|
| *H01L 29/786* | (2006.01) | |
| *H10D 30/67* | (2025.01) | |
| *H10D 62/10* | (2025.01) | |
| *H10D 84/01* | (2025.01) | |
| *H10D 84/03* | (2025.01) | |
| *H10D 84/85* | (2025.01) | |

(52) U.S. Cl.
CPC ....... *H10D 84/0184* (2025.01); *H10D 84/038* (2025.01); *H10D 84/85* (2025.01)

(56) References Cited

U.S. PATENT DOCUMENTS

| | | |
|---|---|---|
| 2020/0035567 A1 | 1/2020 | Chanemougame et al. |
| 2020/0083326 A1 | 3/2020 | Ok et al. |
| 2021/0305408 A1 | 9/2021 | Yu et al. |
| 2022/0165729 A1* | 5/2022 | Shin .................. H10D 84/0167 |

OTHER PUBLICATIONS

Office Action from Taiwanese Patent Application No. 111128892 notified Dec. 9, 2025, 13 pgs.

\* cited by examiner

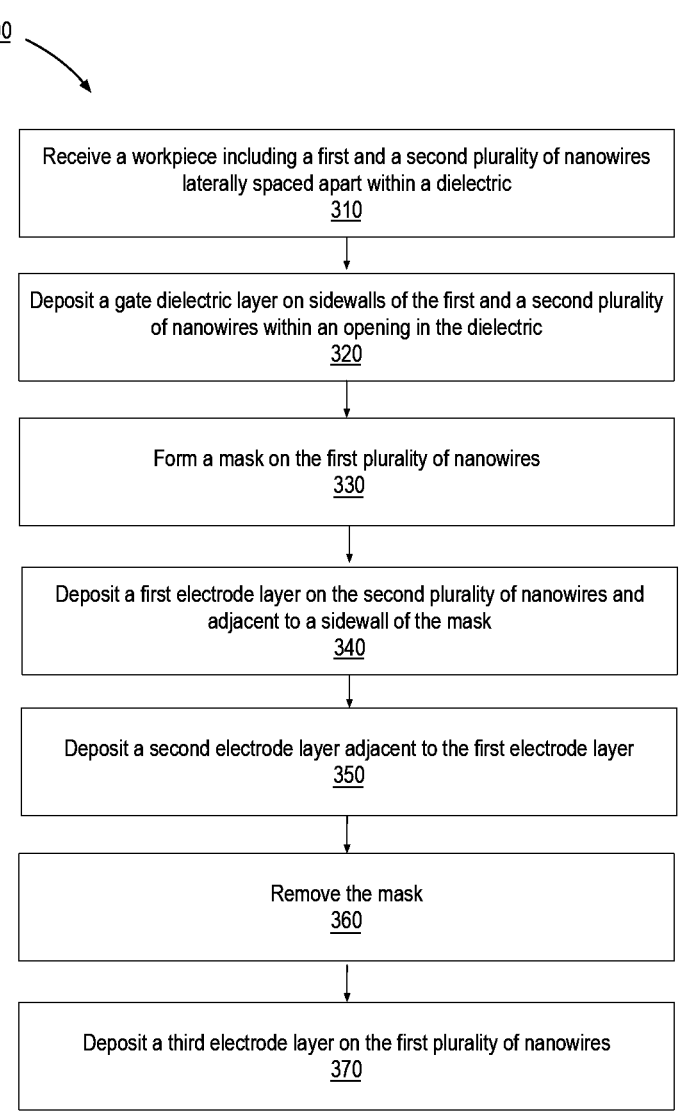

300

Receive a workpiece including a first and a second plurality of nanowires laterally spaced apart within a dielectric
310

Deposit a gate dielectric layer on sidewalls of the first and a second plurality of nanowires within an opening in the dielectric
320

Form a mask on the first plurality of nanowires
330

Deposit a first electrode layer on the second plurality of nanowires and adjacent to a sidewall of the mask
340

Deposit a second electrode layer adjacent to the first electrode layer
350

Remove the mask
360

Deposit a third electrode layer on the first plurality of nanowires
370

FIG. 3

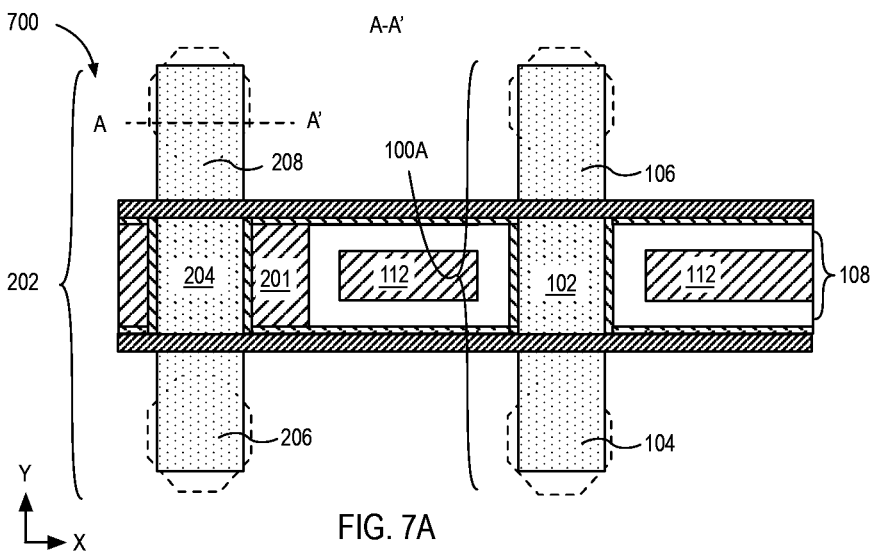
FIG. 7A
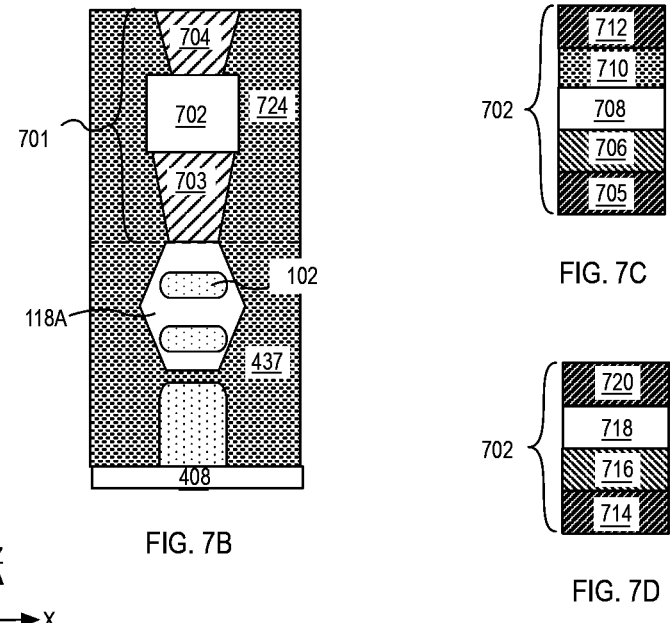
FIG. 7B
FIG. 7C
FIG. 7D

GATE END CAP AND BOUNDARY PLACEMENT IN TRANSISTOR STRUCTURES FOR N-METAL OXIDE SEMICONDUCTOR (N-MOS) PERFORMANCE TUNING

BACKGROUND

Generally. N-Metal Oxide Semiconductor (MOS) and P-MOS devices within a Complementary Metal Oxide Semiconductor (CMOS) nanowire or nanoribbon architecture can operate at different threshold voltages. However, it is often desirable to fine tune threshold voltage in one MOS over another. Thus, there is a need to find a method to enable reliable tuning of threshold voltage in single MOS CMOS devices for SOC applications.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 3 is a method to fabricate a CMOS nanoribbon transistor such as illustrated in FIG. 2A, in accordance with an embodiment of the present disclosure.

FIG. 7A illustrates a cross-sectional view of a memory cell including a transistor structure in accordance with some embodiments.

FIG. 7B is a cross-sectional illustration of the memory cell shown in FIG. 7A, in accordance with some embodiments.

FIGS. 7C and 7D are cross-sectional illustrations of memory element material stacks, in accordance with some embodiments.

DETAILED DESCRIPTION

Figure 1A:
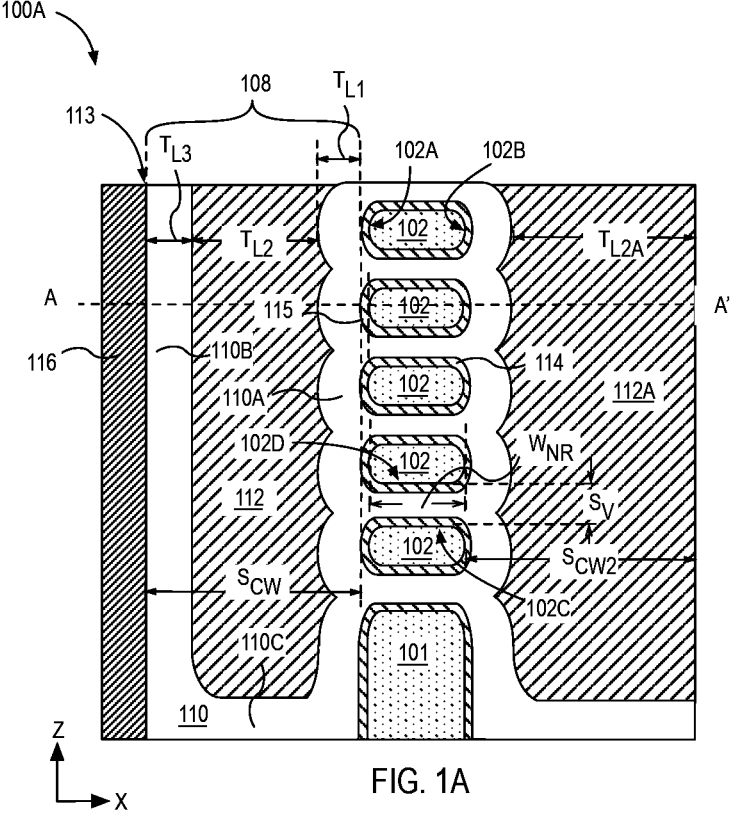
FIG. 1A is a cross-sectional illustration of an NMOS nanoribbon transistor including a dual layer gate electrode, in accordance with an embodiment of the present disclosure.

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

NMOS boundary wall placement in single MOS and CMOS architectures are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with capacitors, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected." along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between." and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over." "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Threshold voltage ($V_T$) tuning in CMOS devices is highly desirable because integrated circuits require devices with a wide variety of $V_T$ to accommodate a wide variety of applications. For example, integrated circuit designers implement low-$V_T$ transistors when device performance is critical, for example, on the critical paths of a circuit. High-$V_T$ transistors may be implemented performance is not critical. High-$V_T$ transistors can be slower but utilize less power because leakage current may be lower compared to a low-Vt transistors. Low-$V_T$ transistors can have orders of magnitude faster switching, for example, but with a penalty of higher leakage. $V_T$ tuning in nanowire or nanoribbon devices is even more desirable because of all CMOS-type devices, nanowire or nanoribbon devices provide the best electrostatic gate control for very short channels (less than 20 nm gate length).

$V_T$ tuning in CMOS nanowire devices may be accomplished by a number of different techniques of which, changing gate dielectric layer type and thickness independently in N and PMOS transistors, and changing channel length are the most prominent. However, because gate dielectric layers can be deposited for N and PMOS transistors separately, the resultant $V_T$ cannot be finely tuned between different NMOS devices and between different PMOS devices. Furthermore, such implementations require complex processing requirements (multiple masks etc) that are difficult to accurately tune in tight (sub 30 nm space) nanowire or nanoribbon geometries where precise gate all around electrostatic control is desired. Furthermore, even via relatively less complicated processing operations, the $V_T$ shifts obtained are often greater 45 mV. Other methods include application of voltage biasing between different parts of the transistor for example, between the body and the drain to bring about $V_T$ shifts.

The inventors have devised a solution for tuning $V_T$ in NMOS transistors that is applicable in dual layer electrode systems. For example, a gate electrode that includes a first conductive layer having a first workfunction directly adjacent to the gate dielectric layer and a second conductive layer with a different work function adjacent to the first conductive layer.

The threshold voltage of NMOS (NVT) is determined primarily by a NMOS work function (N-WF) material directly adjacent to the gate dielectric layer on sidewalls of the nanowire. However, a P-WF material on top of the N-WF is also found to bring about a $V_T$ shift due to a shine through effect. The amount of shine through depends on both the type of material of the P-WF as well as on a ratio between the P-WF material and the N-WF material.

The relative thickness of each layer can be tuned by deposition, however, two different layers the same thickness cannot in generally be varied across different devices in a given wafer. The inventors have devised two solutions to address two different types of devices. One solution, implemented on devices adjacent to gate endcap, utilizes moving the location of the gate endcap wall relative to a sidewall of a nanowire channel to tune the space available for N and P-WF gate material deposition. Because of the deposition process utilized and the geometry of the wall and the channel sidewall, a portion of the N-WF material is also deposited adjacent to the gate endcap wall in addition to a channel sidewall. By positioning the gate endcap wall a certain distance relative to the nanowire channel, the amount of P-WF material deposited between the N-WF material adjacent to the channel sidewall and the N-WF material deposited adjacent to the wall can be tuned. By controlling the distance between the gate endcap wall and device edge, the NMOS $V_T$ can be finely tuned for a cell specific need and can be advantageous for CMOS devices.

Another solution involves shifting a CMOS workfunction material boundary between adjacent NMOS and PMOS nanowire transistors to effectuate a $V_T$ shift. Because the distance between two nanowires in a CMOS device is fixed (determined by patterning), the total lateral thickness for both N and P work function metals is also fixed. However, by shifting the N-P workfunction material boundary, the spacing adjacent to sidewalls of nanowire channels corresponding to an NMOS nanowire transistor can be tuned. Shifting the N-P boundary can be accomplished by implementing a mask that changes the well boundary.

FIG. 1A is a cross-sectional illustration of a device structure 100A (herein NMOS transistor 100A) that includes a plurality of channel regions 102 (e.g., fin, nanoribbon or nanowire channel regions), each including a respective sidewall 102A and a respective sidewall 102B opposite to the sidewall 102A. Sidewalls 102A may be substantially vertical or have a curved surface as shown. As shown the channel regions 102 are arranged in a vertical stack, which may be aligned over a base region 101. In exemplary embodiments, the channel regions 102 include single crystalline silicon, SiGe or Ge.

Figure 1B:
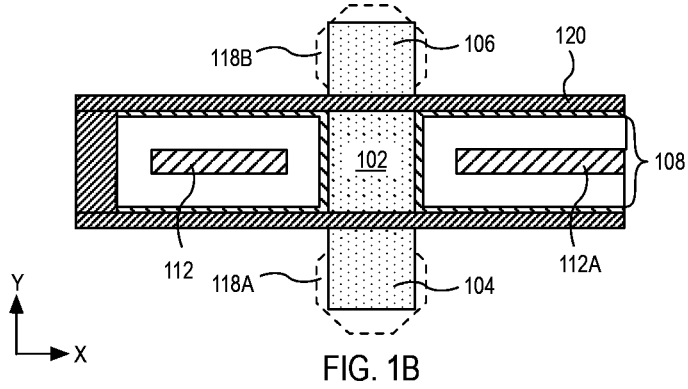
FIG. 1B is a plan-view illustration through a line A-A' of the structure in FIG. 1A, illustrating the various components of the NMOS nanoribbon transistor.

The channel regions 102 extend along a longitudinal direction, as illustrated in the plan-view illustration of FIG. 1B (along the line A-A'). In the illustrative embodiment, the NMOS transistor 100A further includes a source region 104 coupled to a first longitudinal end of the channel regions 102 and a drain region 106 coupled to a second longitudinal end of the channel regions 102. A gate electrode 108 is between the source region 104 and drain region 106.

Referring again to FIG. 1A, the gate electrode 108 includes a plurality of layers. As shown gate electrode 108 includes NMOS-WF layer 110 and an adjacent secondary-WF layer 112 to effectuate electrostatic gate control. The NMOS-WF layer 110 includes an NMOS work function material such as, but not limited to, hafnium, zirconium, titanium, tantalum, aluminum, alloys of these metals, and carbides of these metals such as hafnium carbide, zirconium carbide, titanium carbide, tantalum carbide, and aluminum carbide, and nitrides such as tantalum nitride, titanium nitride. WF layer 112 includes a different work function material than that of NMOS-WF layer 110. The WF layer 112 is directly adjacent to WF layer 110. WF layer 112 includes a material that has a different work function as compared to the work function of WF layer 110. IN some exemplary embodiments, WF layer 112 has a work function that is suitable for a P-MOS device. In some embodiments, WF layer 112 includes a material such as, but not limited to, ruthenium, palladium, platinum, cobalt or nickel, or tungsten, molybdenum, ruthenium, and associated nitrides or carbides of tungsten, ruthenium or molybdenum.

In the illustrative embodiment, the gate electrode 108 includes a particular arrangement of the WF layers 110 and 112 to provide a desired $V_T$ in the transistor 100A. The WF layer 110 includes a WF layer portion 110A adjacent to each respective sidewall 102A of the channel regions 102 and WF layer portion 110B at a gate endcap wall boundary 113 of the transistor 100A The WF layer portion 110A is also contiguous from one sidewall 102A to the next sidewall 102A. As shown, the WF layer portion 110A has a lateral thickness, $T_{L1}$, (or lateral width) that is measured from a gate dielectric layer 114 that is on sidewalls 102A, and directly between the WF layer 110 and the channel region 102.

As shown, WF layer 112 is between portion 110A and portion 110B. WF layer 112 may be substantially conformal with WF layer portions 110A and 110B. WF layer 112 has a lateral thickness $T_{L2}$ that brings about an effective $V_T$ shift in the NMOS transistor 100A during operation. $T_{L2}$ is a function of the thickness, $T_{L1}$ of WF layer portion 110A, thickness, $T_{L3}$ WF layer portion 110B, and a spacing, $S_{NW}$, between the gate dielectric layer 114 on sidewall 102A and the boundary 113. However, wall boundary 113 is engineered to be located a variable distance $S_{CW}$, depending on a particular $T_{L2}$ desired. An upper bound on distance $S_{CW}$ may be determined by spacing constraints between gate to gate spacing between adjacent transistors, for example. In embodiments, $S_{CW}$ is at least 6 nm. In other embodiments, $S_{CW}$ is between 6 nm and 30 nm. In embodiments, a minimum $T_{L1}$ is 2 nm to set a NMOS workfunction in NMOS transistor 100A.

In accordance with some embodiments, the ratio of $T_{L2}$: $T_{L1}$ is less than or equal to 3, the range over which the inventors have found to provide a significant $V_T$ shift. In some embodiments, $S_{NW}$ is between 6 nm and 26 nm. In some exemplary embodiments, a range in $T_{L2}:T_{L1}$ ratio is between slightly greater than zero (for example 0.1) to 2.5. A range in $T_{L2}:T_{L1}$ ratio between slightly greater than zero to 2.5 translates to a range in $V_T$ shift of approximately 30 mV.

In various embodiments, the WF layer portion 110A is substantially conformal with the sidewalls 102A but may have crests and troughs relative to a tangent line 115 that is drawn from an outmost point on the surface of sidewalls 102A. As shown, WF layer 110 also fills a space between each successive channel region 102.

In the illustrative embodiment, a vertical separation, $S_V$, between an uppermost surface 102C of the lowermost channel region 102 and a lowermost surface 102D of the channel region 102 directly above lowermost channel region 102 is at most twice the lateral thickness, $T_{L1}$. In some such embodiments, there is no WF layer 112 between the individual channel regions 102. $S_V$ is determined by a thickness of a sacrificial layer utilized to fabricate nanowires. In most embodiments, the spacing is less than 5 nm to minimize capacitance. The WF layer portion 110A is also contiguous with WF layer portion 110B. In the illustrative embodiment, WF layer 110 further includes a portion 110C under WF layer 112.

In the illustrative embodiment, WF layer 112 is substantially conformal with the WF layer portion 110A and, as such, $T_{L2}$ has a minimum and a maximum value. Variations in minimum and maximum value of $T_{L2}$ may not appreciably alter the range in threshold voltage swing. In some embodiments, $T_{L2}$ may vary with height depending on a relative shape and width, $W_{NR}$, of each channel region 102. For example, $T_{L2}$ may increase with height if $W_{NR}$ decreases from a lowermost channel region 102 to an uppermost channel region 102. In some embodiments, $W_{NR}$ can decrease by 10% with height from a lowermost channel region 102 to an uppermost channel region 102 in the stack channel regions 102. $W_{NR}$ may be between 2 nm and 20 nm depending on embodiments.

A dielectric spacer 120 adjacent to a gate dielectric layer 114 is also shown in FIG. 1A. In various embodiments, the gate dielectric layer 114 includes one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric layer 114 during manufacture of the transistors 100A to improve the quality of the gate dielectric layer 114. In some embodiments, the gate dielectric layer 114 has a thickness between about 1 and 2 nanometers. In some embodiments, the gate dielectric layer 114 has a thickness of at least 1 nm.

As discussed above, a single boundary line associated with a gate end cap is illustrated in FIG. 1A. In the illustrative embodiment, the WF layer portion 110B is adjacent to a dielectric 116 at wall boundary 113. As further illustrated in FIG. 1B, the source and drain regions 104 and 106 may include impurity-doped epitaxial source and drain semiconductor material 118A and 118B.

Figure 1C:
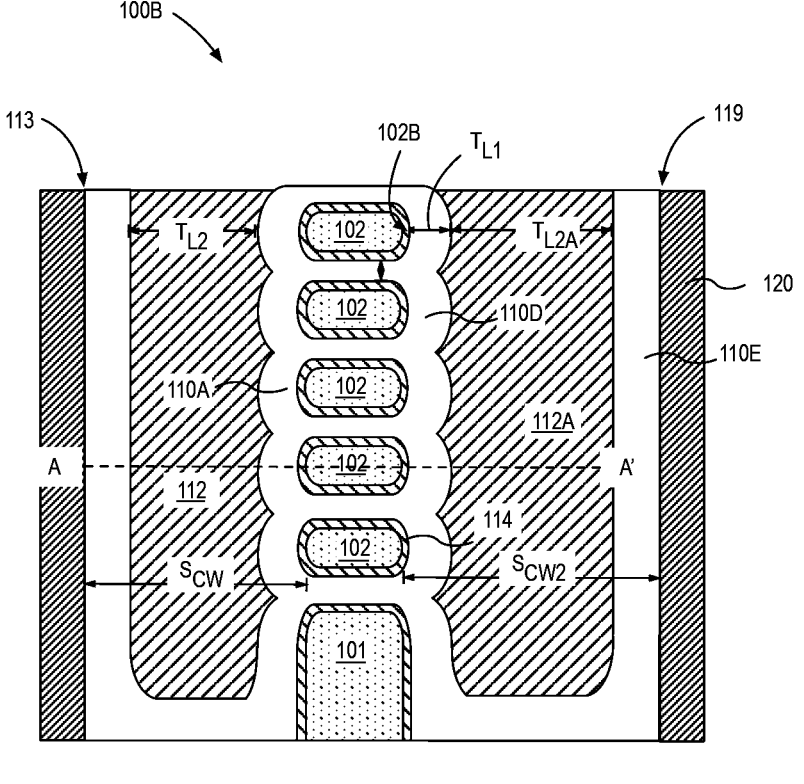
FIG. 1C is a cross-sectional illustration of the NMOS transistor having one or more features of NMOS transistor 100A depicted in FIG. 1A

FIG. 1C is a cross-sectional illustration of an NMOS transistor structure 100B that may have one or more features of NMOS transistor 100A depicted in FIG. 1A. NMOS structure 100B further includes a boundary 119 on opposite boundary 113 with channel regions 102 therebetween. In the illustrative embodiment, the WF layer 110 has a WF layer portion 110D on gate dielectric layer 114 that is on sidewalls 102B of respective channel regions 102. WF layer portion 110E is on boundary 119 adjacent to dielectric 120. As shown, the dielectric 120 is spaced apart from the gate dielectric layer 114 on the respective sidewalls 102B by a distance $S_{CW2}$. $S_{CW2}$ may, or may not, be equal to $S_{CW}$. In embodiments, the difference between $S_{CW}$ and $S_{CW2}$ may be less than 10% of the larger of the two. Such differences can affect the lateral thickness of WF layer portion 112A and impact $V_T$. Hence, a larger $S_{CW2}$ may result in a larger $V_T$ shift from a nominal Vt associated with WF layer 110. In the illustrative embodiment, WF layer portion 112A has a lateral thickness $T_{L2A}$ that is greater than $T_{L2}$. In some embodiments, $V_T$ of the device may be set by an average of the $T_{L2}$ and $T_{L2A}$.

Figures 2A, 2B:
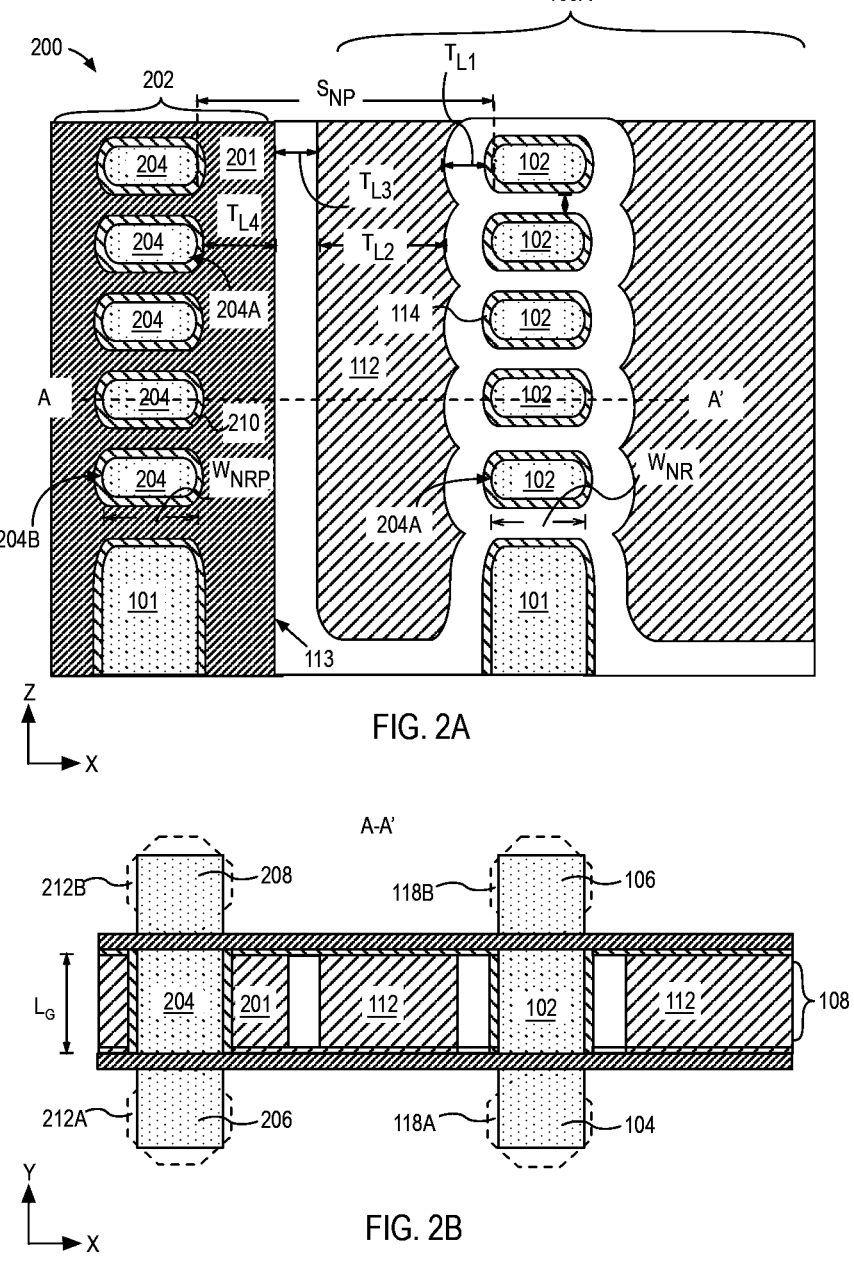
FIG. 2A is a cross-sectional illustration of an NMOS nanoribbon device structure including a dual layer gate electrode adjacent to a PMOS nanoribbon device structure, in accordance with an embodiment of the present disclosure.
FIG. 2B is a plan-view illustration through a line A-A' of the structure in FIG. 2A, illustrating the various components of the NMOS and PMOS nanoribbon transistors.

Specific applications of a dielectric boundary versus a metallic boundary, such as at interface between N and PWF material regions within a CMOS gate structure are further described in the context of FIGS. 2A and 2B. In this exemplary embodiment, NMOS $V_T$ is advantageously tuned for an NMOS transistor 100A that is an element of a CMOS device 200. In CMOS device 200, the NMOS transistor 100A is directly adjacent to a gate electrode 201 of a PMOS transistor 202 such as is illustrated in FIG. 2A. NMOS transistor 100A has one or more properties of NMOS transistor 100A described in association with FIGS. 1A-1B. PMOS transistor 202 may have one or more features of the NMOS transistor 100A.

PMOS transistor 202 includes a plurality of channel regions 204 (e.g., fin, nanoribbon or nanowire channel regions 204), each including a respective sidewall 204A and a respective sidewall 204B opposite to the sidewall 204A. Sidewalls 204A may be substantially vertical or be curved as shown. Also as shown, the channel regions 204 are arranged in a vertical stack. In exemplary embodiments, the PMOS transistor 202 includes same number of individual channel regions 204 as a number of individual channel regions 102. However, channel regions 204 may have a lateral width, $W_{NRP}$ that can be wider or narrower than $W_{NR}$. The width of channel regions 204 can affect the drive current of PMOS transistor 202. In exemplary embodiments, the channel regions 204 and 102 include single crystalline silicon, SiGe or Ge.

The channel regions 204 extend along a longitudinal direction along the y-axis illustrated in FIG. 2B. In the illustrative embodiment, the PMOS transistor 202 further includes a source region 206 coupled to a first longitudinal end of the channel regions 204, and a drain region 208 coupled to a second longitudinal end of the channel regions 204. Gate electrode 201 is between the source region 206 and drain region 208. The gate length, $L_G$, of gate electrodes 108 and 201 may be substantially the same, as illustrated, or differ. The source and drain regions 206 and 208, respectively, may include doped epitaxially grown source and drain structures as indicated by the dashed lines 212A and 212B.

As further illustrated in FIG. 2A, sidewalls 102A are laterally spaced apart from sidewalls 204A by a distance $S_{NP}$, which may be defined by design. However, the placement of boundary 113 may not be so fixed, and can be instead utilized to tune NMOS $V_T$. In the illustrative embodiment, $S_{NP}$ is equal to a combined sum of $T_{L1}$, $T_{L2}$, $T_{L3}$, a lateral thickness $T_{L4}$ of gate electrode 201 and thicknesses of the gate dielectric layer 210 and 114. $T_{L4}$ is measured from gate dielectric layer 210 on sidewalls 204A. For a given $S_{NP}$ and a minimum thickness of $T_{L1}$ and $T_{L3}$, the WF material wall boundary 113 can be moved along the x-direction to effectuate a desired ratio $T_{L2}:T_{L1}$ to tune NMOS $V_T$. In exemplary embodiments, the desired ratio $T_{L2}:T_{L1}$ is less than 3, and is preferably between 0.1 and 2.5 in some specific embodiments. In embodiments where a larger NMOS $V_T$ is required, boundary 113 is closer to gate dielectric layer 210 adjacent to sidewalls 204A relative to a structure where a smaller NMOS $V_T$ is desired. $S_{NP}$ and $T_{L4}$ should be sufficiently large to facilitate an entire range of NMOS $V_T$ values desired for a particular circuit.

In exemplary embodiments, the gate dielectric layer 210 includes a material that is the same or substantially the same as the material of the gate dielectric layer 114. In some such embodiments, gate dielectric layer 210 has a thickness that is the same or substantially the same as the thickness of the gate dielectric layer 114. In other embodiments, gate dielectric layer 210 is different from gate dielectric layer 114. Gate dielectric layer 210, may for example, include two or more layers, where one layer is a high-K material and the other layer includes $SiO_2$.

In some exemplary embodiments, the gate electrode 201 is WF material for PMOS transistor 202, and has the same chemical composition as the WF layer 112. However, gate electrode 201 and the WF layer 112 may also have different compositions and/or include different materials.

Figures 2C, 2D, 2E:
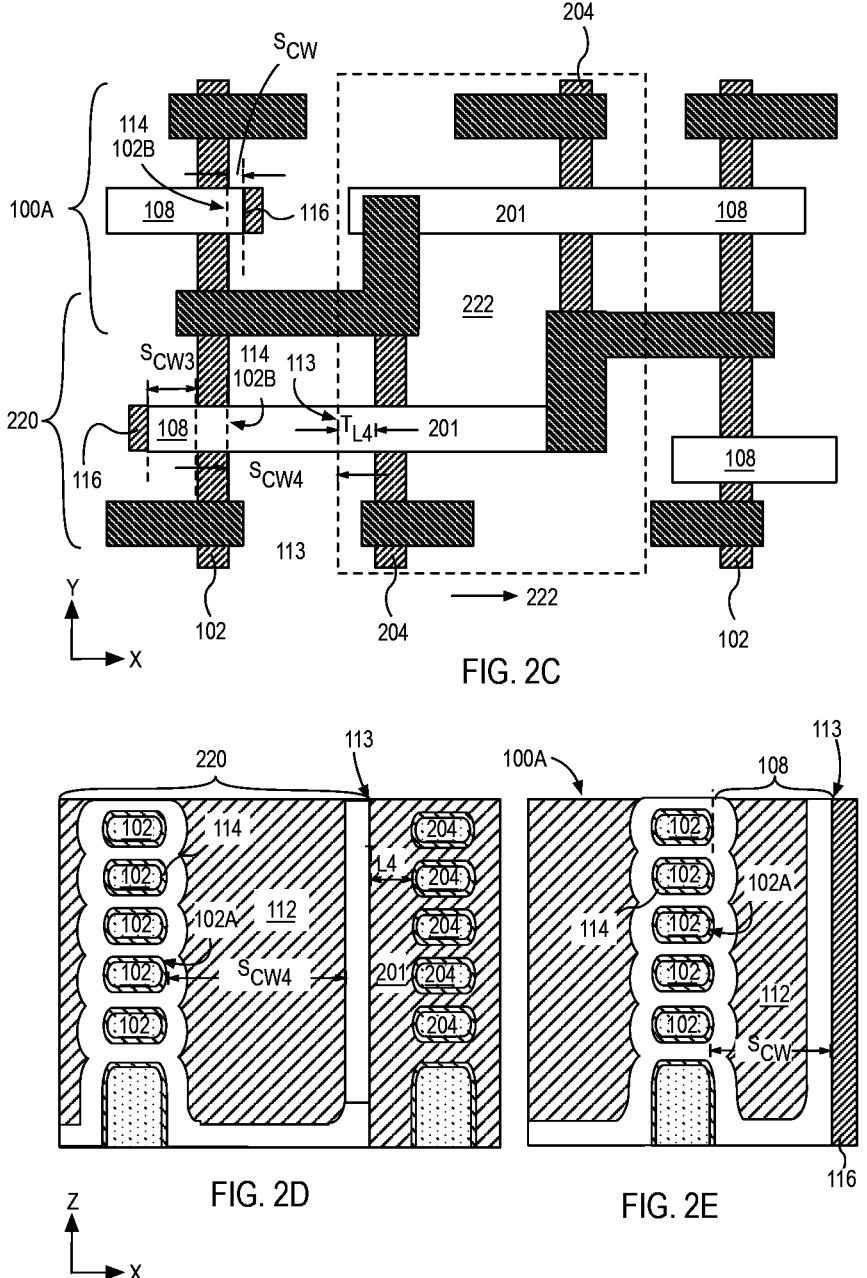
FIG. 2C is a plan-view of an SRAM circuit structure in accordance with some embodiments.
FIGS. 2D and 2E are cross-sectional views of transistor structures in the SRAM circuit structure shown in FIG. 2C, in accordance with some embodiments.

FIG. 2C is a plan view of a 6 Transistor (6T) SRAM cell, illustrating implementation of NMOS $V_T$ tuning by (a) placement of gate endcap and (b) by placement of N-P well boundary. Various NMOS and PMOS transistors are shown in the illustration. FIG. 2D is a cross-sectional illustration of NMOS transistor 220 in FIG. 2C. NMOS transistor 220 has some or all the features of NMOS transistor 100B (described in association with FIG. 1C). FIG. 2E is a cross-sectional illustration of the NMOS transistor 100B in FIG. 2C.

NMOS transistor 100A, has some or all the features of NMOS transistor 100A, as described in reference to FIG. 1A. As shown in FIG. 2C, end cap dielectric 116 facilitates a shorter spacing $S_{CW}$ between gate end cap 116 and the gate dielectric layer 114 on sidewall 102B of the channel region 102 compared to a spacing $S_{CW3}$ between gate end cap 116 and the gate dielectric layer 114 on sidewall 102A of the channel region 102 in NMOS transistor 220. Smaller spacing, $S_{CW}$, provides a lower NMOS $V_T$, while a larger spacing $S_{CW3}$ provides a higher NMOS $V_T$ for the given WF material compositions. Also as shown, CMOS boundary 113 is shifted away (indicated by arrow 222) from the NMOS transistor 220 to increase spacing $S_{CW4}$ and raise the NMOS $V_T$. In an embodiment, a single threshold voltage tuning mask can be implemented to so raise NMOS $V_T$ in transistor 220 while lowering NMOS $V_T$ in transistor 100A. FIG. 2C is therefore an example where a single $V_T$ mask can set the distance between the wall and device edge, finely tuning the NMOS $V_T$ to provide a pass gate with a tighter gate end cap and lower NMOS $V_T$ while the pull down transistor has a larger gate end cap with a CMOS boundary 113 shifted away from the transistor to raise NMOS $V_T$.

FIG. 3 is a method 300 to fabricate transistor such as those described above, in accordance with some embodiment of the present disclosure. The method 300 begins at operation 310 where a work piece including a first plurality of nanowires adjacent to a second plurality of nanowires embedded in a dielectric is received. An opening in the dielectric extends orthogonally across a portion of the first and second plurality of nanowires. The method 300 continues at operation 320 wherein a gate dielectric layer is deposited on first sidewalls and on second sidewalls of the first and the second plurality of nanowires. The method 300 continues at operation 330 where a portion of the first plurality of nanowires in the opening are masked. The method 300 continues at operation 340 where a first electrode layer is deposited on the gate dielectric layer on the exposed sidewalls and on a sidewall of the mask. The method 300 continues at operation 350 where a second electrode layer is deposited on the first electrode layer. The second electrode layer fills any space between the first electrode layer on the sidewall of the mask and on exposed sidewalls of the channel regions. The method 300 continues at operation 360 where the mask is removed. Method 300 completes at operation 370, where a third electrode layer is deposited on the gate dielectric layer on the respective first sidewalls.

Figures 4A, 4B, 4C:
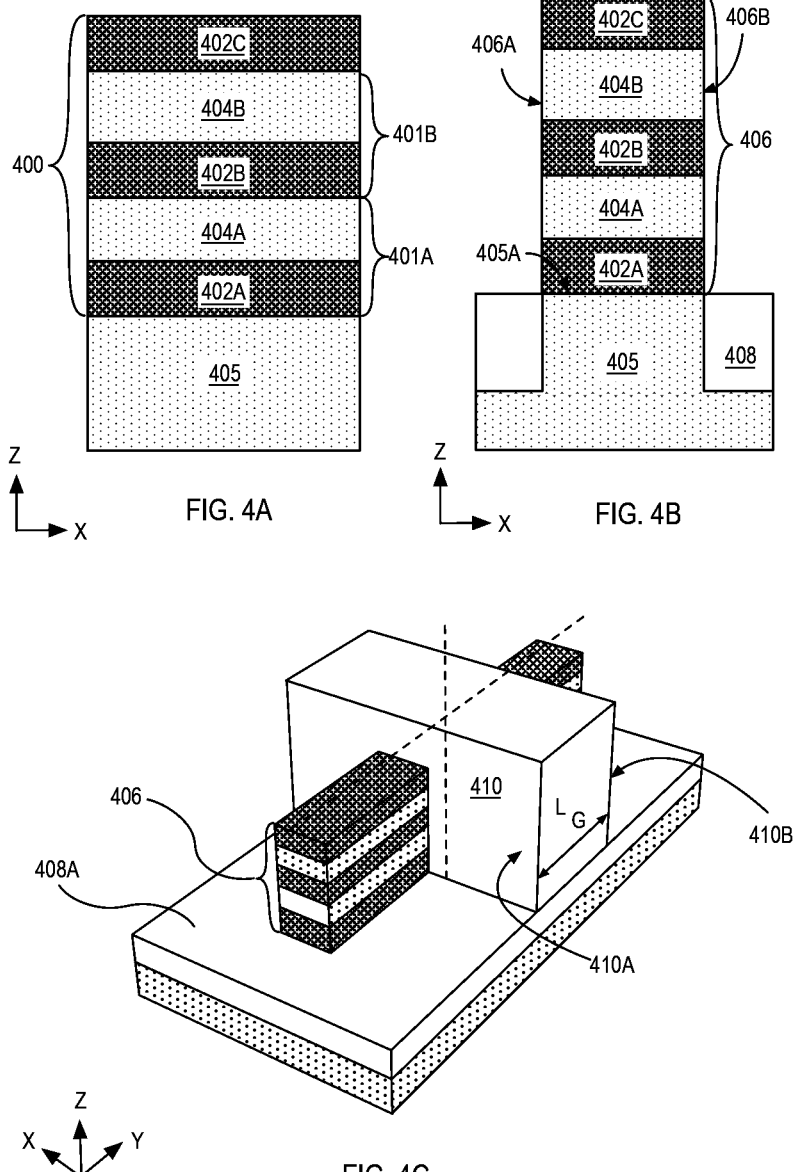
FIG. 4A is a cross-sectional illustration of material layer stack for fabrication of a nanoribbon transistor device, where the material layer stack includes a plurality of bilayers, where each of the bilayer includes a sacrificial layer on a monocrystalline silicon, in accordance with an embodiment of the present disclosure.
FIG. 4B is a cross sectional illustration of a block formed by patterning the material layer stack.
FIG. 4C is an isometric illustration following the formation of a dummy gate structure formed on a first portion of the block.

FIG. 4A is a cross-sectional illustration of material layer stack 400 suitable for fabrication of a transistor device, in accordance with some embodiments. As shown, a material layer stack 400 having a plurality of bilayers is on a substrate 405. In the illustrative embodiment, the material layer stack 400 includes a bilayer 401A and a bilayer 401B on bilayer 401A. In an exemplary embodiment, bilayer 401A includes a sacrificial layer 402A and a channel layer 404A, which includes monocrystalline silicon. Bilayer 401B includes a sacrificial layer 402B and a channel layer 404B, which includes monocrystalline silicon. In the illustrative embodiment, the bilayer 401B is capped by a sacrificial layer 402C.

In an embodiment, sacrificial layers 402A, 402B and 402C include silicon and germanium such as $Si_{1-x}Ge_x$, where X is between 0.3-0.35. In at embodiment, the sacrificial layers are doped to increase wet etch removal rates relative to silicon. In an exemplary embodiment, sacrificial layer 402A can be grown epitaxially on the substrate 405 to follow the crystal orientation of the substrate 405. In an embodiment, the substrate 405 includes silicon where the silicon substrate has a top surface having a (001) crystal plane.

The layer 404A is formed on layer 402A, where layer 404A includes a material of the channel regions 102. In an embodiment, the silicon is a (001) silicon. In an embodiment, the process to grow the materials in the bilayer 401A is repeated until a desired number of silicon channel layers are formed within a Si/SiGe superlattice stack 400.

The thickness of the material layer stack 400 may be limited by an aspect ratio of a fin structure, for example, after patterning of the material layer stack 400. For a given total thickness of the material layer stack 400, individual thickness of the sacrificial layers 402A, 402B and 402C may be limited by a minimum thickness required of the layers 404A and 404B. However, the thickness of the sacrificial layers 402A, 402B and 402C determine the spacing between channels that will be formed in a downstream process. In embodiments, the sacrificial layer 402A is grown to a thickness between 10 nm and 15 nm. Depending on embodiments, silicon layer 404A has a thickness that is between 5 nm and 15 nm.

In an embodiment, the material layer stack 400 is a Si/SiGe super lattice, where the super lattice material layer stack 400 is formed by a reduced pressure CVD process. It is to be appreciated that the deposition process minimizes $Si_{1-x}Ge_x$, strain relaxation to enable longitudinal strain in transistor channels that are to be subsequently formed.

In the illustrative embodiment, a bilayer 401B is formed on the silicon layer 404A of bilayer 401A. The layer 402B in the bilayer 401B is epitaxially formed on silicon layer 404A. The thickness of the layer 402B may or may not be equal to the thickness of the layer 402A. In an exemplary embodiment, the silicon layers 404A and 404B are substantially the same, i.e., they both include a same material and have a same or substantially the same thickness, as is shown in FIG. 4A. The material layer stack 400 further includes a layer 402C formed on the bilayer 401. While two bilayers 401A and 401B are shown, the number of bilayers can be between 2-10. FIG. 4B is a cross sectional illustration of a block 406 formed by patterning the material layer stack 400 (shown in FIG. 4A). In an embodiment, prior to patterning a mask is formed on the topmost layer 402C that defines a shape and size of the block 406. In the illustrative embodiment, one block is shown, but in exemplary embodiments, a plurality of blocks are simultaneously patterned to form a plurality of nanoribbon channels. In an embodiment, a plasma etch process may be utilized to pattern and form the block 406. The plasma etch defines channels and etches a portion of the substrate 405. The etch process is halted after etching a desired amount of silicon. In exemplary embodiments, the sidewalls 406A and 406B may be substantially vertical as shown. It is to be appreciated that when the sidewall profiles 406A are substantially vertical, the lateral width of each channel layer that will be subsequently be formed may have substantially a same lateral dimension (defined by the space between the sidewall 406A and 406B).

After formation of block 406, a dielectric 408 is formed on the block 406 and on sidewalls of the block 406. The dielectric 408 is then polished until a top surface of the dielectric 408 is substantially coplanar with a top surface of the dielectric. In an embodiment, a chemical mechanical polish (CMP) process is utilized to planarize the dielectric. The dielectric 408 may be then recessed to a level at or below the uppermost surface 405A of the substrate 405 as shown. In an embodiment, a wet etch process is used to recess the dielectric 408.

FIG. 4C is an isometric illustration following the formation of a dummy gate structure 410 formed on a first portion of the block 406. In an embodiment, a dummy gate dielectric layer such as silicon oxide, or $Al_2O_3$, is blanket deposited on the block 406 and on the dielectric 408 and a sacrificial material is deposited on the dummy gate dielectric. In an embodiment, the dummy gate material includes a mask on sacrificial material. A plasma may be utilized, for example, to pattern the mask and sacrificial material and dummy gate material into dummy gate structure 410. In an exemplary embodiment, the plasma etch process is selective to an uppermost surface 408A of the dielectric 408. In an embodiment, the dummy gate structure 410 has sidewalls 410A and 410B that are substantially vertical relative to an uppermost dielectric surface 408A. The dummy gate structure 410 has a lateral width, $L_G$. $L_G$ defines a width of a transistor gate that is to be formed.

Figure 4D:
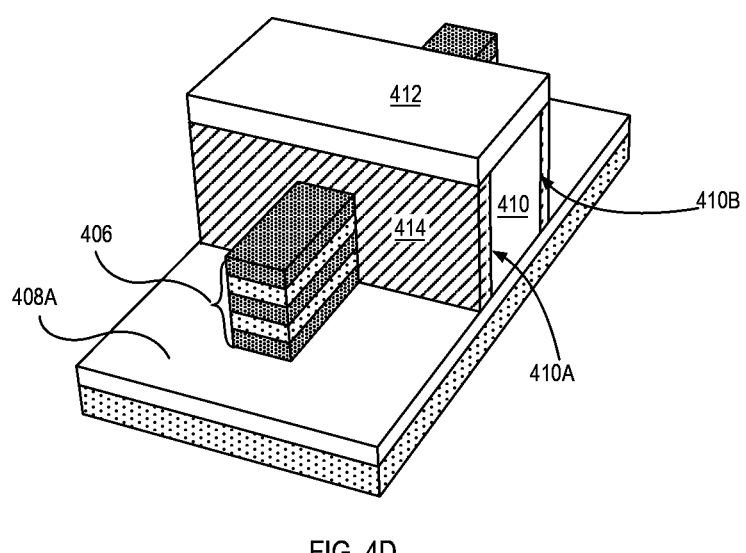
FIG. 4D is an isometric illustration of the structure in FIG. 4C following the formation of a dielectric spacer adjacent to the dummy gate structure.

FIG. 4D is an isometric illustration of the structure in FIG. 4C following the formation of a dielectric spacer 414 adjacent to the dummy gate structure 410. In an embodiment, a dielectric spacer layer is blanket deposited on the block 406 and on the dummy gate structure 410 and on sidewalls 410A and 410B. The deposition process utilized may include a PECVD (plasma enhanced chemical vapor deposition), physical vapor deposition (PVD), chemical vapor deposition (CVD) process. In an embodiment, the dielectric spacer layer includes silicon and nitrogen and/or carbon.

In an embodiment, the dielectric spacer layer is planarized. The planarization process may expose an uppermost surface of the dummy gate structure 410. As shown, a mask 412 is formed over the dummy gate structure 410 and over a portion of the dielectric spacer layer. The dielectric spacer layer is etched to form dielectric spacer 414. A plasma etch may be utilized to pattern the dielectric spacer 414. An over etch of the dielectric spacer layer is carried out to remove the dielectric spacer layer from sidewall portions of the block 406 that are not covered by the mask.

In the illustrative embodiment, the dielectric spacer 414 is formed on sidewall portions of the block 406 directly adjacent to the dummy gate structure 410. As shown, the dummy gate structure 410 and the dielectric spacer 414 both cover portions of the sidewalls of the block 406.

The dielectric spacer 414 may be formed to a thickness that is determined by downstream process, electrical performance requirements (such as modulation of external resistance) or a combination thereof. In an embodiment, the dielectric spacer 414 has a lateral width between 5 nm to 10 nm.

Figure 4E:
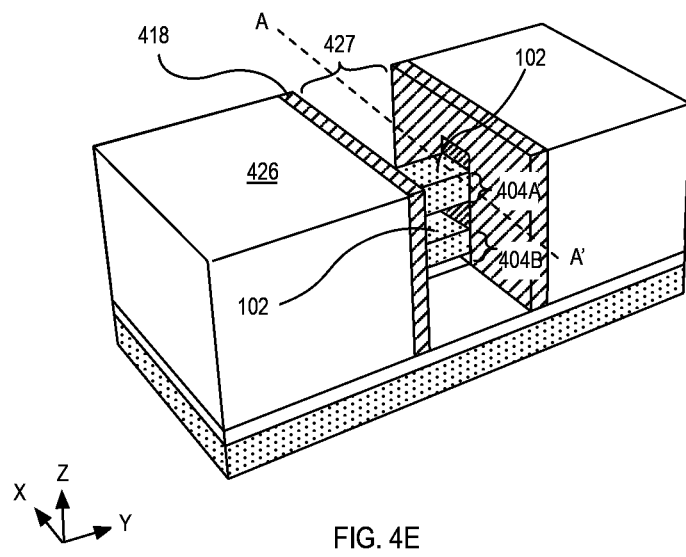
FIG. 4E illustrates the structure of FIG. 4D following the process to remove a hardmask, the dummy gate structure and sacrificial layers exposed after removing the dummy gate structure to form nanoribbon channels.

FIG. 4E illustrates the structure of FIG. 4D following the process to remove the hardmask 412, the dummy gate structure 410 and sacrificial layers exposed after removing the dummy gate structure 410 to form channel regions 102. In an embodiment, a dielectric 426 is deposited on the structure of FIG. 4D and planarized. The planarization process removes the hardmask 412. In an embodiment, where the dummy gate structure 410 includes a dummy gate material such as polysilicon, silicon germanium, germanium, a combination of plasma etch, and wet chemical etch can be utilized to remove the dummy gate structure 410. Removal of the dummy gate structure 410 does not affect the silicon layers 404A and 404B, because of the presence of a dummy gate dielectric under the dummy gate material (as described in association with FIG. 4C). Removal of the dummy gate structure 410 forms an opening 427 as illustrated.

In an embodiment, a wet chemical process is utilized to remove the sacrificial layers 402A, 402B and 402C (FIG. 4B). The wet etch chemistry may selectively etch 402A, 402B and 402C with respect to a dummy gate dielectric layer on silicon layers 404A and 404B, dielectric spacer 418, and dielectric 426. After removal of sacrificial layers 402A, 402B and 402C, silicon layers 404A and 404B become suspended channel regions 102. The dielectric spacer 418 remains adjacent to the dielectric 426.

Figure 5A:
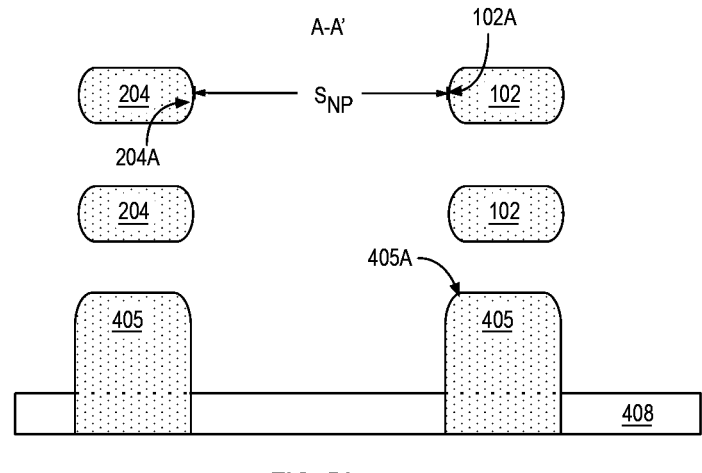
FIG. 5A is a cross-sectional illustration through a line A-A' of the structure in FIG. 4E.

FIG. 5A is a cross-sectional illustration through a line A-A' of the structure in FIG. 4E. An additional pair of channel regions 204 are added in the cross-sectional illustration to illustrate a CMOS pair of transistor structures. The channel regions 204 and channel regions 102 are spaced apart by a distance, $S_{NP}$. $S_{NP}$ is set by design rules and represents a distance between nearest sidewalls 102A and 204A of the channel regions 204 and channel regions 102, respectively. In the illustrated embodiment, the dielectric 408 is recessed below the uppermost surface 405A of the substrate 405.

Figure 5B:
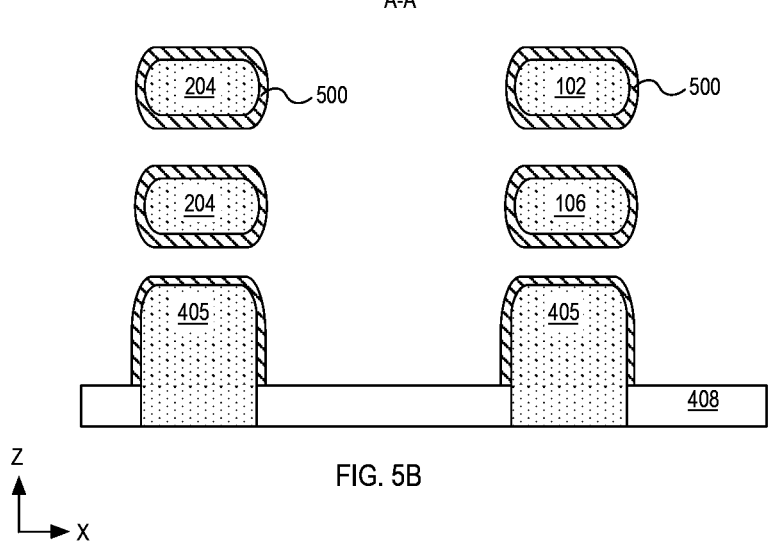
FIG. 5B is a cross-sectional illustration of the structure in FIG. 5A following the formation of a gate dielectric layer on the nanoribbon channels as well as on a substrate.

FIG. 5B is a cross-sectional illustration of the structure in FIG. 5A following the formation of a gate dielectric layer 500 on the channel regions 204 and channel regions 102 as well as on the substrate 405. In an embodiment, the gate dielectric layer 500 is deposited by an ALD process. An ALD process facilitates coverage of gate dielectric layer 500 on surfaces that are not in a vertical line of sight. As shown, gate dielectric layer 500 may be blanket deposited on all exposed surfaces or prevented from being deposited on some surfaces such as dielectric 408 by a surface treatment. In the illustrative embodiment, the gate dielectric layer 500 is deposited to a same thickness on each of the channel regions 204 and channel regions 102 and, as shown, is substantially conformal to outermost surface of the respective channel regions 204 and channel regions 102.

Figures 5C, 5D:
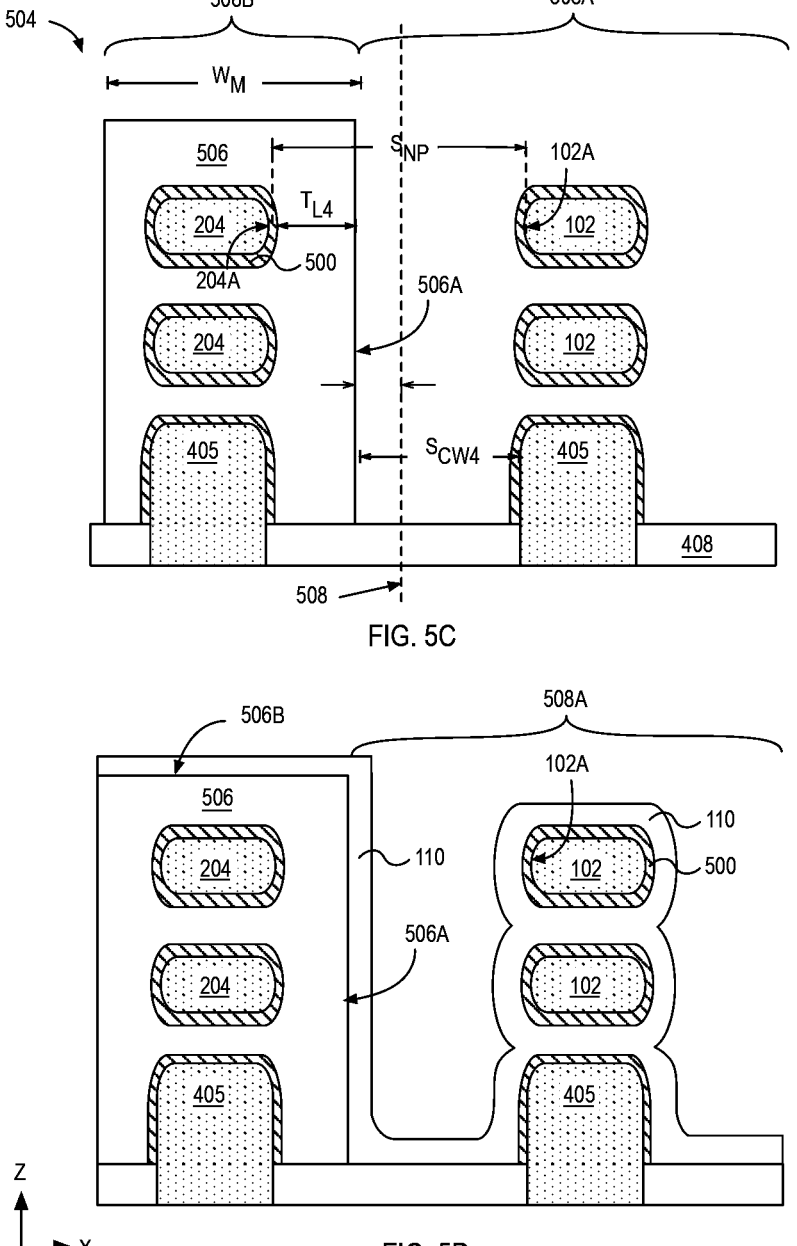
FIG. 5C is a cross-sectional illustration of the structure in FIG. 5B following the process to form a mask.
FIG. 5D is a cross-sectional illustration of the structure in FIG. 5C following the formation of an WF layer to set a baseline NMOS $V_T$.

FIG. 5C is a cross-sectional illustration of the structure in FIG. 5B following the process to form a mask 506 on a portion of structure 504. The mask 506 exposes an NMOS region 508A and protects a PMOS region 508B.

In the illustrative embodiment, the mask 506 may be formed by depositing a flowable material that is easy to pattern. Examples of mask materials include compounds of silicon, and one or more of oxygen, nitrogen or carbon. After deposition the mask material is patterned to form a mask 506 having a sidewall 506A. The positioning of the sidewall 506A relative to sidewall surfaces 102A of each channel region 102 and a planned thickness of an NMOS work function material can help to obtain a desired NMOS $V_T$. In an embodiment, the mask 506 has a lateral width, $W_M$, that is pre-determined and aligned with a P-N well boundary 508. Boundary 508 is defined in the substrate before patterning stack 400 (FIG. 4A). In various embodiments, the sidewall 506A of the mask 506 is positioned along a point in the x-direction that provides a certain thickness ratio between dual work function layers to be deposited adjacent to channel regions 102. In the illustrative embodiment, the mask sidewall 506A is positioned a distance, $T_{L4}$, away from the gate dielectric layer 500 adjacent to sidewalls 204A, resulting in a shift in the mask in the negative x-direction. Since $S_{NP}$ is fixed, a negative shift in the mask 506 increases the separation between sidewall 506A and the gate dielectric layer 500 on sidewalls 102A. Such a shift provides more lateral space for work function material deposition and can facilitate an NMOS $V_T$ increase. The amount of lateral displacement of the mask 506 in the positive or negative directions can advantageously facilitate an offset of NMOS $V_T$ from a baseline level determined by implementation of a single N-work function electrode.

FIG. 5D is a cross-sectional illustration of the structure in FIG. 5C following the formation of a WF layer 110 to set a baseline NMOS $V_T$. In an embodiment, the WF layer 110 is deposited by an ALD process. The WF layer 110 is formed substantially conformally on portions of the gate dielectric layer 500 that are on respective sidewalls 102A and 102B.

The ALD process can also advantageously fill the vertical spacing between each successive channel region 102. In the illustrative embodiment, the WF layer 110 is deposited to a thickness $T_{L1}$ on the gate dielectric layer 500. In exemplary embodiments, the WF layer 110 is also deposited conformally to a thickness $T_{L1}$ on sidewall 506A of mask 506 and on top surface 506B. In some embodiments, the portion of the WF layer 110 on sidewall 50A has a different thickness than $T_{L1}$. The spacing between the WF layer 110 on sidewall 506A and on the gate dielectric layer 500 on sidewalls 102A is designed to produce a certain ratio between a second work function layer to be deposited. In the illustrative embodiment, the WF layer 110 is also deposited on the dielectric 408.

Figure 5E:
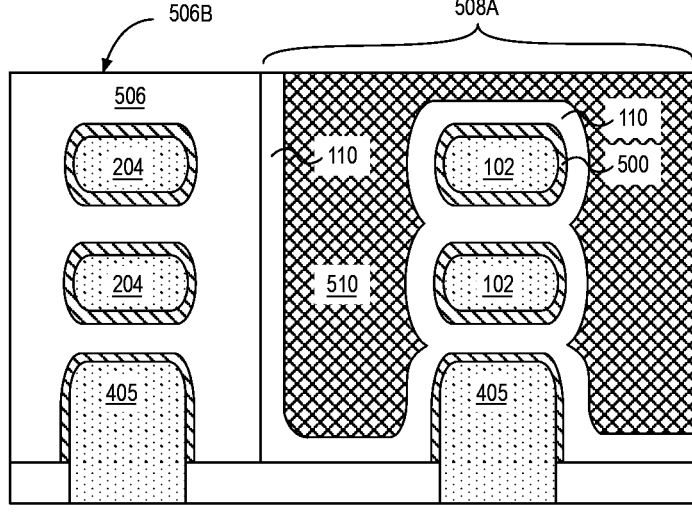
FIG. 5E is a cross-sectional illustration of the structure in FIG. 5D following the process to deposit a sacrificial material on the NMOS WF layer followed by a planarization process.

FIG. 5E is a cross-sectional illustration of the structure in FIG. 5D following deposition of a sacrificial material 510 on the WF layer 110 and a planarization process. In an embodiment, the sacrificial material includes a material that is the same or substantially the same as the material of the mask 506. In some embodiments, the sacrificial material includes polycrystalline silicon which facilitates removal by both wet chemical methods as well as plasma etch processes. A planarization process is performed to remove the sacrificial material from above the WF layer 110 above the mask 506. The planarization process is continued until the WF layer 110 above the mask is removed and uppermost surface 506B is exposed. In an embodiment, a chemical mechanical polish (CMP) process is utilized to planarize.

Figure 5F:
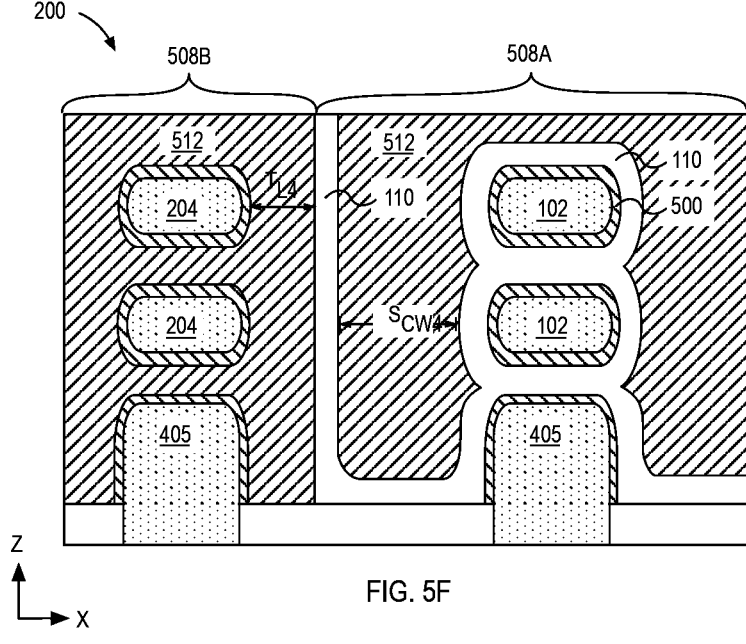
FIG. 5F is a cross-sectional illustration of the structure in FIG. 5E following the process to remove the mask and the sacrificial material and deposit a second WF layer.

FIG. 5F is a cross-sectional illustration of the structure in FIG. 5E following removal of mask 506 and sacrificial material 510, and deposition of WF layer 512. The mask 506 and the sacrificial material 510 may be both removed simultaneously by a wet chemical etch or a plasma etch selective to the WF layer 110 and gate dielectric layer 114, for example. In other embodiments, each of the mask 506 and the sacrificial material 510 are removed sequentially by separate processes.

WF layer 512 is deposited in PMOS region 508B and in the NMOS region 508A, and planarized to remain only in PMOS region 508A. In the illustrative embodiment, single material of the WF layer 512 sets a work function for a PMOS gate "shines-through" WF layer 110 to modulate the NMOS $V_T$ by an amount that is dependent on $T_{L4}$ and/or $SC_{W4}$. After deposition the excess WF layer 512 is planarized and removed to form a CMOS transistor 200.

In other embodiments, removal of the sacrificial layers in the NMOS region 508A and PMOS region 508B separately can facilitate deposition of two different work function materials in the respective regions.

Figure 6A:
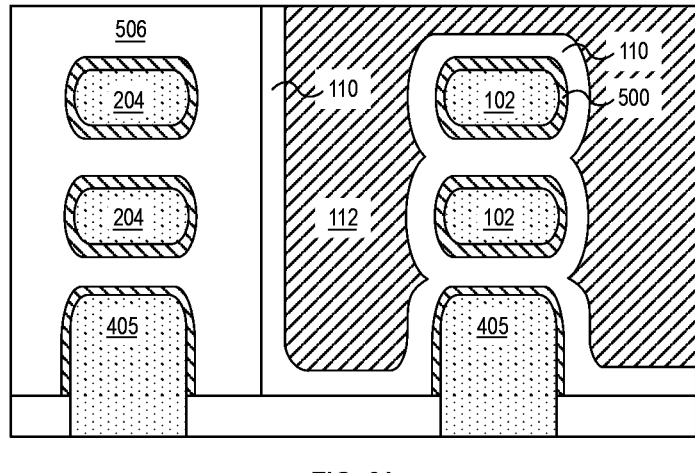
FIG. 6A is a cross-sectional illustration of the structure in FIG. 5E following the process to remove the sacrificial material from an NMOS region and deposit a third WF layer on the NMOS WF layer.

FIG. 6A is a cross-sectional illustration of the structure in FIG. 5E following the process to remove the sacrificial material 510 from the NMOS region 508A and deposit a WF layer 112 on the WF layer 110. The WF layer 112 may then be planarized to provide a substantially planar uppermost surface of WF layer 112.

Figure 6B:
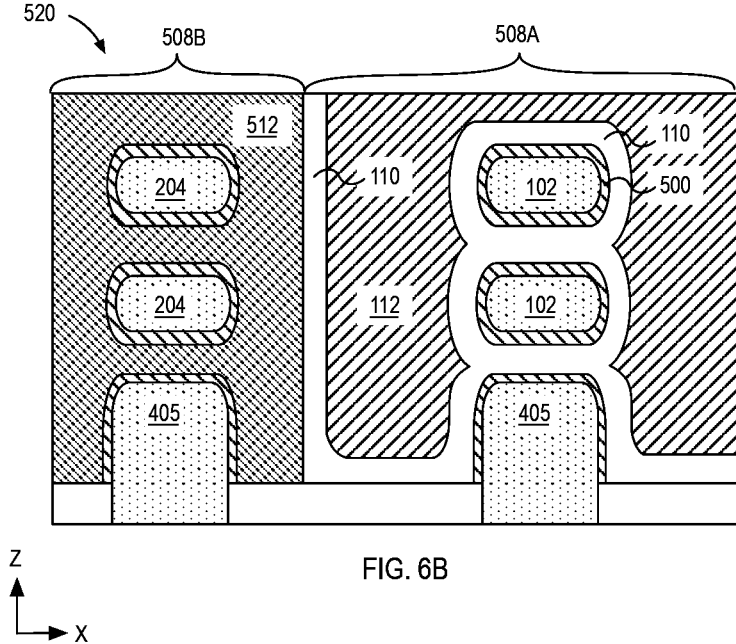
FIG. 6B is a cross-sectional illustration of the structure in FIG. 6A following the process to remove the mask from the PMOS region, deposit a PMOS WF layer, followed by a planarization process to fabricate a CMOS transistor.

FIG. 6B is a cross-sectional illustration of the structure in FIG. 6A following the process to remove the mask 506 from the PMOS region 508B, deposit WF layer 512, followed by a planarization process to fabricate CMOS transistor 520. In the illustrative embodiment, WF layer 512 includes a different material than a material of the WF layer 112.

The device structures and method of fabrication may be applied to a variety of integrated circuits. FIG. 7A illustrates a cross-sectional view of a memory cell 700 including a transistor 100A, for example as described elsewhere herein, and a memory structure 701 coupled to a contact of the transistor 100A. In the illustrative embodiment, the memory structure 701 is coupled to a drain contact of the transistor 100A. In other embodiments, the memory cell 700 also includes plurality of memory structures such as memory structure 701 individually coupled with transistors 202 and 100A.

FIG. 7B is a cross-sectional illustration of the memory structure 701 through a line A-A' in the structure of FIG. 7A, in accordance with an embodiment of the present disclosure. As shown, the memory structure 701 includes a non-volatile memory element 702 between a drain contact 703 and an interconnect 704. In other embodiments, there are one or more levels of interconnect between drain contact 703 and volatile memory element 702. In the illustrative embodiment, the drain contact 703 is in contact with the epitaxial drain structure 212B.

Non-volatile memory element 702 may include a magnetic tunnel junction (MTJ) device, a conductive bridge random access memory (CBRAM) device, or a resistive random-access memory (RRAM) device. A non-volatile memory element such as an MTJ device requires a nominal critical switching current, that depends on an MTJ device area, to undergo magnetization switching. As an MTJ is scaled down in size, the critical switching current required to switch the memory state of the MTJ device also scales proportionally with device area, however scaling MTJ's presents numerous challenges. If a transistor connected to an MTJ device can deliver an amount of current that exceeds critical switching current requirement of the MTJ device, then feature size scaling of MTJ devices can be relaxed. In an embodiment, a non-planar transistor such as NMOS transistor 100A, which can provide a current boost (through properly targeted $V_T$), can be advantageously coupled to non-volatile memory element 702 such as an MTJ device to overcome critical switching current requirements.

FIG. 7C illustrates a cross-sectional view of an example non-volatile memory element 702 that includes a magnetic tunnel junction (MTJ) material device. In the illustrated embodiment, the MTJ device includes a bottom electrode 705, a fixed magnet 706 above the bottom electrode 705, a tunnel barrier 708 on the fixed magnet 706, a free magnet 710 on the tunnel barrier 708, and a top electrode 712 on the free magnet 710. In an embodiment, a dielectric spacer laterally surrounds (not shown) non-volatile memory element 702.

In an embodiment, fixed magnet 706 includes a material and has a thickness sufficient for maintaining a fixed magnetization. For example, fixed magnet 706 may include an alloy such as CoFe and CoFeB. In an embodiment, fixed magnet 706 includes $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, fixed magnet 706 is FeB, where the concentration of boron is between 10 and 40 atomic percent of the total composition of the FeB alloy. In an embodiment, the fixed magnet 706 has a thickness that is between 1 nm and 2.5 nm.

In an embodiment, tunnel barrier 708 is composed of a material suitable for allowing electron current having a majority spin to pass through tunnel barrier 708, while impeding, at least to some extent, electron current having a minority spin from passing through tunnel barrier 708. Thus, tunnel barrier 708 (or spin filter layer) may also be referred to as a tunneling layer for electron current of a particular spin orientation. In an embodiment, tunnel barrier 708 includes a material such as, but not limited to, magnesium oxide (MgO) or aluminum oxide ($Al_2O_7$). In an embodiment, tunnel barrier 708 including MgO has a crystal orientation that is (001) and is lattice matched to free magnet 710 below tunnel barrier 708 and fixed magnet 706 above tunnel barrier 708. In an embodiment, tunnel barrier 708 is MgO and has a thickness is between 1 nm to 2 nm.

In an embodiment, free magnet 710 includes a magnetic material such as Co, Ni, Fe or alloys of these materials. In an embodiment, free magnet 710 includes a magnetic material such as FeB, CoFe and CoFeB. In an embodiment, free magnet 710 includes a $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, free magnet 710 is FeB, where the concentration of boron is between 10 and 40 atomic percent of the total composition of the FeB alloy. In an embodiment, free magnet 710 has a thickness that is between 1 nm and 2.0 nm.

In an embodiment, bottom electrode 705 includes an amorphous conductive layer. In an embodiment, bottom electrode 705 is a topographically smooth electrode. In an embodiment, bottom electrode 705 includes a material such as W, Ta, TaN or TiN. In an embodiment, bottom electrode 705 is composed of Ru layers interleaved with Ta layers. In an embodiment, bottom electrode 705 has a thickness between 20 nm and 50 nm. In an embodiment, top electrode 712 includes a material such as W, Ta, TaN or TiN. In an embodiment, top electrode 712 has a thickness between 30 nm and 70 nm. In an embodiment, bottom electrode 705 and top electrode 712 are the same metal such as Ta or TiN. In an embodiment, the MTJ device has a combined total thickness of the individual layers is between 60 nm and 100 nm and a width is between 10 nm and 50 nm.

Referring again to FIG. 7B, in an embodiment, non-volatile memory element 702 is a resistive random-access memory (RRAM) that operates on the principle of filamentary conduction. When an RRAM device undergoes an initial voltage breakdown, a filament is formed in a layer known as a switching layer. The size of the filament depends on the magnitude of the breakdown voltage and reliable switching between different resistance states in a filamentary RRAM device can be greatly enhanced at larger current. In an embodiment, transistor 100A, that can provide an additional current boost (through increase in drive current), can be advantageously coupled to an RRAM device to provide reliable switching operation.

FIG. 7D illustrates a cross-sectional view of an example non-volatile memory element 702 that includes a resistive random-access memory (RRAM) device. In the illustrated embodiment, the RRAM material stack includes a bottom electrode 714, a switching layer 716 over the bottom electrode 714, an oxygen exchange layer 718 over the switching layer 716, and a top electrode 720 on the oxygen exchange layer 718.

In an embodiment, bottom electrode 714 includes an amorphous conductive layer. In an embodiment, bottom electrode 714 is a topographically smooth electrode. In an embodiment, bottom electrode 714 includes a material such as W, Ta, TaN or TiN. In an embodiment, bottom electrode 714 is composed of Ru layers interleaved with Ta layers. In an embodiment, bottom electrode 714 has a thickness is between 20 nm and 50 nm. In an embodiment, top electrode 720 includes a material such as W, Ta, TaN or TiN. In an embodiment, top electrode 720 has a thickness is between 70 and 70 nm. In an embodiment, bottom electrode 714 and top electrode 720 are the same metal such as Ta or TiN.

Switching layer 716 may be a metal oxide, for example, including oxygen and atoms of one or more metals, such as, but not limited to Hf, Zr, Ti, Ta or W. In the case of titanium or hafnium, or tantalum with an oxidation state +4, switching layer 716 has a chemical composition, $MO_X$, where O is oxygen and X is or is substantially close to 2. In the case of tantalum with an oxidation state +5, switching layer 716 has a chemical composition, $M_2O_X$, where O is oxygen and X is or is substantially close to 5. In an embodiment, switching layer 716 has a thickness is between 1 nm and 5 nm.

Oxygen exchange layer 718 acts as a source of oxygen vacancy or as a sink for $O^{2-}$. In an embodiment, oxygen exchange layer 718 is composed of a metal such as but not limited to, hafnium, tantalum or titanium. In an embodiment, oxygen exchange layer 718 has a thickness is between 5 nm and 20 nm. In an embodiment, the thickness of oxygen exchange layer 718 is at least twice the thickness of switching layer 716. In another embodiment, the thickness of oxygen exchange layer 718 is at least twice the thickness of switching layer 716. In an embodiment, the RRAM device has a combined total thickness of the individual layers is between 60 nm and 100 nm and width is between 10 nm and 50 nm.

Referring again to FIG. 7B, the drain contact 703 is embedded in dielectric 437. A dielectric 724 is on the dielectric 437. In the illustrative embodiment, the drain interconnect 704 and the non-volatile memory element 702 is embedded in the dielectric 724.

In an embodiment, the drain contact 703 and the drain interconnect 704 includes a liner layer including ruthenium or tantalum and a fill metal such as copper or tungsten. In embodiments dielectric 724 includes silicon and one or more of nitrogen, oxygen and carbon such as, silicon nitride, silicon dioxide, carbon doped silicon nitride, silicon oxynitride or silicon carbide.

Figure 8:
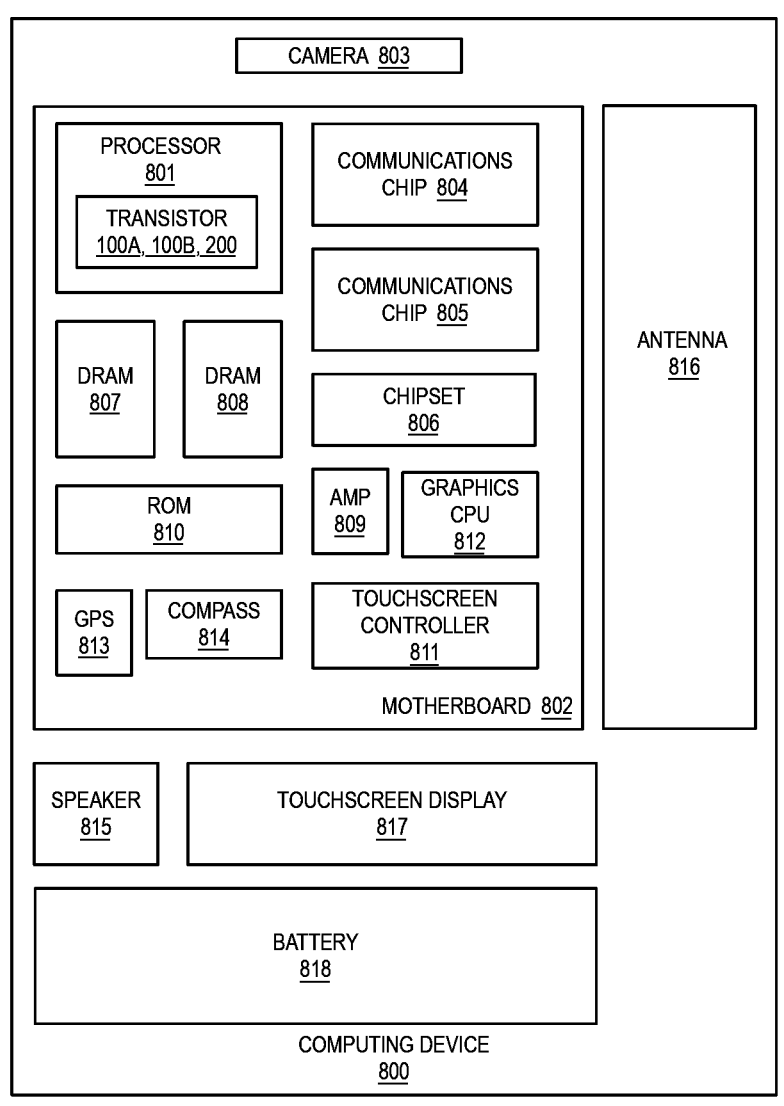
FIG. 8 illustrates a computing device in accordance with embodiments of the present disclosure.

FIG. 8 illustrates a computing device 800 in accordance with embodiments of the present disclosure. As shown, computing device 800 houses a motherboard 802. Motherboard 802 may include a number of components, including but not limited to a processor 801 and at least one communications chip 804 or 805. Processor 801 is physically and electrically coupled to the motherboard 802. In some implementations, communications chip 805 is also physically and electrically coupled to motherboard 802. In further implementations, communications chip 805 is part of processor 801.

Depending on its applications, computing device 800 may include other components that may or may not be physically and electrically coupled to motherboard 802. These other components include, but are not limited to, volatile memory (e.g., DRAM), non-volatile memory (e.g., ROM), flash memory, a graphics processor, a digital signal processor, a crypto processor, a chipset 806, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 805 enables wireless communications for the transfer of data to and from computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 805 may implement any of a number of wireless standards or protocols, including but not limited to Wi-Fi (IEEE 801.11 family), WiMAX (IEEE 801.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 8G, and beyond. Computing device 800 may include a plurality of communications chips 804 and 805. For instance, a first communications chip 805 may be dedicated to shorter range wireless communications such as Wi-Fi and Bluetooth and a second communications chip 804 may be dedicated to longer range wireless communications such as GPS, EDGE, GPRS, CDMA, WiMAX, LTE, Ev-DO, and others.

Processor 801 of the computing device 800 includes an integrated circuit die packaged within processor 801. In some embodiments, the integrated circuit die of processor 801 includes non-volatile memory devices, one or more device structures that include transistors such as transistors 100A, 100B, or 200 as described in association with FIG. 1A, 1B or 2A-B, respectively. Referring again to FIG. 8, the term "processor" may refer to any device or portion of a device that processes electronic data from registers and/or memory to transform that electronic data into other electronic data that may be stored in registers and/or memory.

Communications chip 805 also includes an integrated circuit die packaged within communication chip 805. In another embodiment, the integrated circuit die of communications chips 804, 805 includes one or more interconnect structures, non-volatile memory devices, capacitors. Depending on its applications, computing device 800 may include other components that may or may not be physically and electrically coupled to motherboard 802. These other components may include, but are not limited to, volatile memory (e.g., DRAM) 807, 808, non-volatile memory (e.g., ROM) 810, a graphics CPU 812, flash memory, global positioning system (GPS) device 813, compass 814, a chipset 806, an antenna 816, a power amplifier 809, a touchscreen controller 811, a touchscreen display 817, a speaker 815, a camera 803, and a battery 818, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 800 and discussed above may contain a stand-alone integrated circuit memory die that includes one or more arrays of nonvolatile memory devices.

In various implementations, the computing device 800 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
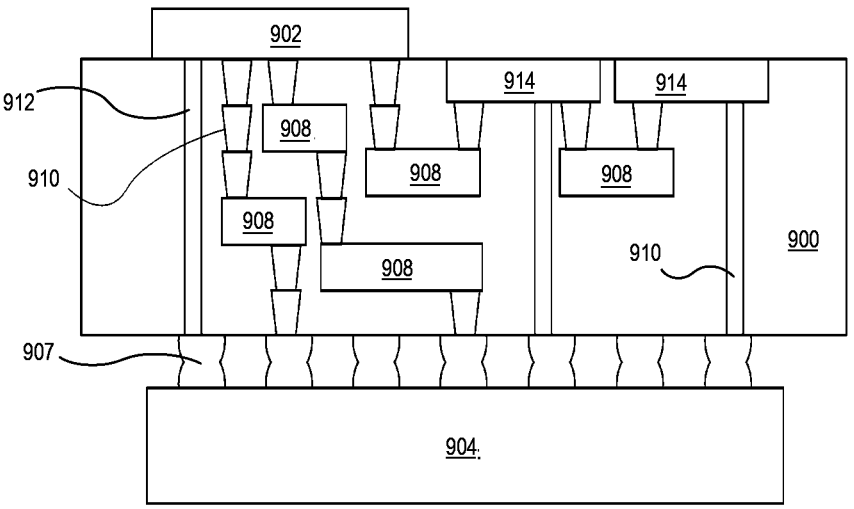
FIG. 9 illustrates an integrated circuit (IC) structure.

FIG. 9 illustrates an integrated circuit (IC) structure 900 that includes one or more embodiments of the disclosure. The integrated circuit (IC) structure 900 is an intervening substrate used to bridge a first substrate 902 to a second substrate 904. The first substrate 902 may be, for instance, an integrated circuit die. The second substrate 904 may be, for instance, a memory module, a computer mother, or another integrated circuit die. Generally, the purpose of an integrated circuit (IC) structure 900 is to spread a connection to a wider pitch or to reroute a connection to a different connection. For example, an integrated circuit (IC) structure 900 may couple an integrated circuit die to a ball grid array (BGA) 907 that can subsequently be coupled to the second substrate 904. In some embodiments, the first substrate 902 and the second substrate 904 are attached to opposing sides of the integrated circuit (IC) structure 900. In other embodiments, the first substrate 902 and the second substrate 904 are attached to the same side of the integrated circuit (IC) structure 900. And in further embodiments, three or more substrates are interconnected by way of the integrated circuit (IC) structure 900.

The integrated circuit (IC) structure 900 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 908 and vias 910, including but not limited to through-silicon vias (TSVs) 912. The integrated circuit (IC) structure 900 may further include embedded devices 914, including both passive and active devices. Such embedded devices 914 include capacitors, resistors, inductors, fuses, diodes, transformers, device structures including transistors, such as transistors 100A, 100B, or 200 as described in association with FIG. 1A,1B or 2A-B, respectively. Referring again to FIG. 9, the integrated circuit (IC) structure 900 may further include embedded devices such as one or more resistive random-access devices, sensors, and electrostatic discharge (ESD) devices. More complex devices such as radiofrequency (RF) devices, power amplifiers, power management devices such as decoupling capacitors (as described in association with FIGS. 1A, 1B, 2A-C), antennas, arrays, sensors, and MEMS devices may also be formed on the integrated circuit (IC) structure 900.

NMOS boundary wall placement in single MOS and CMOS architectures are described are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Besides what is described herein, various modifications may be made to the disclosed embodiments and implementations thereof without departing from their scope, as demonstrated by the following examples.

Example 1: A device structure includes a plurality of ribbon channels, where each ribbon channel includes a respective first sidewall and a respective second sidewall opposite to the first sidewall, where the plurality of ribbon channels are arranged in a stack and extend along a longitudinal direction. The device structure also includes a source on a first longitudinal end of the plurality of ribbon channels and a drain on a second longitudinal end of the plurality of ribbon channels, a gate electrode between the source and drain. The gate electrode includes a first layer includes a first portion adjacent to the respective first sidewalls, a second layer directly adjacent to the first layer and a second portion of the first layer adjacent to the second layer, where the first portion of the first layer includes a first work function material and a first lateral thickness from a gate dielectric layer between the first layer and the respective first sidewalls, where the second layer includes a second work function material and a second lateral thickness, where the second portion of the first layer includes a third lateral thickness and where the ratio of the second lateral thickness to the first lateral thickness is less than three.

Example 2: The device structure according to example 1, where the second portion is adjacent to a dielectric that is a first distance away from the gate dielectric layer adjacent to the respective first sidewalls.

Example 3: The device structure according to any of one examples 1 through 2, where the third lateral thickness is substantially equal to the first lateral thickness and where the first lateral thickness and the second lateral thickness each have a minimum value of 2 nm.

Example 4: The device structure according to any of one examples 1 through 3, where the first layer includes a third portion below the second layer, where the third portion is contiguous with the first and second portions.

Example 5: The device structure according to any of one examples 1 through 4, where the plurality of ribbon channels is a first plurality of ribbon channels of a first transistor, where the source is a first source, where the drain is a first drain, where the gate dielectric layer is a first gate dielectric layer, where the gate electrode is a first gate electrode, and where the second portion of the first layer is directly adjacent to a second gate electrode of a second transistor. The second transistor includes a second plurality of ribbon channels each including a respective first sidewall and a respective second sidewall opposite to the first sidewall, where the plurality of ribbon channels are arranged in a stack and extend along a longitudinal direction. The second transistor further includes a second source on a first longitudinal end of the second plurality of ribbon channels and a second drain on a second longitudinal end of the second plurality of ribbon channels and where the second gate electrode is between the second source and the second drain and around each of the second plurality of ribbon channels and where the second gate electrode includes a third workfunction material and a second gate dielectric layer is between second gate electrode and the second plurality of ribbon channels.

Example 6: The device structure according to any of one examples 1 through 5, where the respective first sidewalls of first plurality of ribbon channels are closest to the respective first sidewalls of the second plurality of ribbon channels, and where the respective first sidewalls of first plurality of ribbon channels and the respective first sidewalls of the second plurality of ribbon channels are laterally spaced apart by a distance, where the second gate electrode includes a fourth lateral thickness equal to a difference between the distance minus a combined sum of the first thickness, the second thickness, the third thickness, a thickness of the first gate dielectric layer and a thickness of the second gate dielectric layer.

Example 7: The device structure according to any of one examples 1 through 6, where the ratio is greater than 0 and less than 2.5.

Example 8: The device structure according to any of one examples 1 through 7, where the first gate dielectric layer and second gate dielectric layer include a same material and the third work function material is the same as the second work function material.

Example 9: The device structure according to any of one examples 1 through 8, where the first layer is further around each of the plurality of ribbon channels, where the first layer further includes a third portion adjacent to the respective second sidewalls, where the third portion includes the first lateral thickness, where the second layer adjacent to the first portion is a first portion of the second layer, and the second layer further includes a second portion adjacent to the third portion of the first layer, the second portion of the second layer includes a fourth lateral thickness, and where a ratio of the fourth lateral thickness to the first lateral thickness is greater than the ratio of the second lateral thickness to the first lateral thickness.

Example 10: The device structure according to any of one examples 1 through 9, where the plurality of ribbon channels is a first plurality of ribbon channels of a first transistor, where the source is a first source, where the drain is a first drain, where the gate dielectric layer is a first gate dielectric layer, where the gate electrode is a first gate electrode, and where the device structure of claim 1 further includes a second transistor. The second transistor includes a third plurality of ribbon channels each including a respective first sidewall and a respective second sidewall opposite to the first sidewall, and where the plurality of ribbon channels are arranged in a stack and extend along a longitudinal direction. A third source is on a first longitudinal end of the plurality of ribbon channels and a third drain is on a second longitudinal end of the plurality of ribbon channels. A third gate electrode is between the third source and the third drain, where the third gate electrode include a third layer including a first portion adjacent to the respective first sidewalls and a fourth layer directly adjacent to the third layer. The third gate electrode further includes a second portion of the third layer adjacent to the second layer, where the first portion of the third layer includes the first work function material and the first lateral thickness from the respective first sidewalls, where the fourth layer includes the second work function material and a fourth lateral thickness, where the second portion of the third layer includes the third lateral thickness and where a ratio of the fourth lateral thickness to the first lateral thickness is less than the ratio of the third lateral thickness to the first lateral thickness. The second transistor further includes a third gate dielectric layer including a material of the first gate dielectric layer, the third gate dielectric layer between the third gate electrode and the third plurality of ribbon channels.

Example 11: The device structure according to example 10, where a threshold voltage of third transistor, is higher than a threshold voltage of the first transistor by at least 30%.

Example 12: The device structure according to any of one examples 1 through 11, where the first layer includes hafnium, zirconium, titanium, tantalum or aluminum, alloys of hafnium, zirconium, titanium, tantalum or aluminum, and carbides of hafnium, zirconium, titanium, tantalum or aluminum such as hafnium carbide, zirconium carbide, titanium carbide, tantalum carbide, and aluminum carbide, and nitrides such as tantalum nitride, titanium nitride, and the second layer includes ruthenium, palladium, platinum, cobalt or nickel, or tungsten, molybdenum, ruthenium, and nitrides or carbides of tungsten, ruthenium or molybdenum.

Example 13: The device structure according to any of one examples 1 through 11, where a vertical separation between a lowermost surface of a first ribbon channel in the plurality of ribbon channels and an uppermost surface of a second ribbon channel in the plurality of ribbon channels is at most two times the first lateral thickness, where the second ribbon channel is directly above the first ribbon channel.

Example 14: A method to fabricate a device structure the method includes receiving a work piece that includes a first plurality of ribbon channels adjacent to a second plurality of ribbon channels embedded in a dielectric, where the first plurality and the second plurality of ribbon channels extend along a longitudinal direction, where the plurality of first ribbon channels each comprise a respective first sidewall and where the plurality of second ribbon channels each comprise a respective second sidewall, where an opening in the dielectric extends orthogonally across the longitudinal direction and exposes a portion of the first plurality and the second plurality of ribbon channels and the first and second sidewalls. The method further includes depositing a gate dielectric layer on the respective first sidewalls and on the respective second sidewalls and masking the portion of the first plurality of ribbon channels in the opening by forming a mask on the first plurality of ribbon channels, where the mask includes a sidewall, and where the sidewall is a distance away from the respective second sidewalls. The method further includes forming a first gate electrode by depositing a first electrode layer on the gate dielectric layer on the respective second sidewalls and on the sidewall of the mask, by depositing a second electrode layer on the first electrode layer and filling a space between the first electrode layer formed on the sidewall of the mask and on the respective second sidewalls, by removing the mask, and by forming a second gate electrode. Forming the gate electrode includes depositing a third electrode layer on the gate dielectric layer adjacent the respective first sidewalls.

Example 15: The method according to any of one examples 14, where forming the mask further includes placing the sidewall a first distance away from the respective second sidewalls of the second plurality of fins, such that a ratio of the lateral thickness of the second electrode layer to a lateral thickness of the first electrode layer is approximately less than 3.

Example 16: The method according to any of one examples 15, w where the distance is between 6 nm and 30 nm.

Example 17: The method according to any of one examples 16, where removing the mask includes removing the mask prior to forming the second electrode layer, and where forming the second electrode layer and the third electrode layer includes depositing a same material.

Example 18: The method according to any of one examples 17, where forming the second electrode layer and the third electrode layer includes depositing a same material during a single deposition.

Example 19: A system includes a battery, an antenna and a processor coupled to the antenna, where the processor includes a device structure. The device structure includes a plurality of ribbon channels, where each ribbon channel includes a respective first sidewall and a respective second sidewall opposite to the first sidewall, where the plurality of ribbon channels are arranged in a stack and extend along a longitudinal direction. The device structure also includes a source on a first longitudinal end of the plurality of ribbon channels and a drain on a second longitudinal end of the plurality of ribbon channels, a gate electrode between the source and drain. The gate electrode includes a first layer includes a first portion adjacent to the respective first sidewalls, a second layer directly adjacent to the first layer and a second portion of the first layer adjacent to the second layer, where the first portion of the first layer includes a first work function material and a first lateral thickness from a gate dielectric layer between the first layer and the respective first sidewalls, where the second layer includes a second work function material and a second lateral thickness, where the second portion of the first layer includes a third lateral thickness and where the ratio of the second lateral thickness to the first lateral thickness is less than three.

Example 20: The system according to example 19, where the third lateral thickness is substantially equal to the first lateral thickness and where the first lateral thickness and the second lateral thickness have a minimum value of 2 nm and where in the ratio is between 0.1 and 2.5.

What is claimed is:

1. A device structure comprising:
a first plurality of channel regions in a stack of a first transistor, each of the channel regions comprising a first sidewall and a second sidewall opposite of the first sidewall;
a source region and a drain region coupled to opposite ends of the first plurality of channel regions; and
a gate electrode between the source regions and the drain regions, the gate electrode comprising:
a first layer comprising a first portion adjacent to the first sidewall and a second portion adjacent to a boundary sidewall spaced apart from the first sidewall, wherein the boundary sidewall comprises a dielectric material, and is a first distance away from a first gate dielectric layer that is adjacent to the first sidewall; and
a second layer directly adjacent to the first layer, and occupying a space between the first and second portions of the first layer;
wherein:
the first layer is a first workfunction material having a first composition associated with a first workfunction, wherein the first layer comprises a third portion below the second layer, wherein the third portion is contiguous with the first and second portions;
the first portion of the first layer is of a first lateral thickness from the first sidewall;
the second portion of the first layer is directly adjacent to a second gate electrode of a second transistor further comprising a second gate dielectric layer and a second plurality of channel regions in a stack;
the second layer is a second workfunction material having a second composition associated with a second workfunction, and is of a second lateral thickness from the first sidewall;
a ratio of the second lateral thickness to the first lateral thickness is less than three;
the first sidewalls of the first plurality of channel regions are laterally spaced apart by a distance from first sidewalls of the second plurality of channel regions; and
the second gate electrode is of a fourth lateral thickness equal to a difference between the distance minus a sum of the first lateral thickness, the second lateral thickness, a third lateral thickness of the second portion of the first layer, a lateral thickness of the first gate dielectric layer, and a lateral thickness of the second gate dielectric layer.

2. The device structure of claim 1, wherein the third lateral thickness is substantially equal to the first lateral thickness, and wherein the first lateral thickness and the second lateral thickness each have a minimum value of 2 nm.

3. The device structure of claim 1, wherein the second transistor comprises
a second source and a second drain coupled to ends of the second plurality of channel regions, and wherein the second gate electrode comprises a third workfunction material.

4. The device structure of claim 3, wherein the ratio of the second lateral thickness to the first lateral thickness is greater than 0 and less than 2.5.

5. The device structure of claim 3, wherein the first gate dielectric layer and second gate dielectric layer include a same material, and the third workfunction material has the same composition as the second workfunction material.

6. The device structure of claim 1, wherein the first layer is around each of the plurality of channel regions, wherein a second portion of the second layer is adjacent to second sidewalls of the channel regions, opposite the first sidewalls, and has a lateral thickness that is greater than the first lateral thickness by more than the ratio of the second lateral thickness to the first lateral thickness.

7. The device structure of claim 1, wherein the device structure further comprises a third transistor, the third transistor comprising a third gate electrode comprising:
a third layer comprising the first material associated with a first work function; and
a fourth layer directly adjacent to the third layer, the fourth layer comprising the second workfunction material;
wherein the third layer is adjacent to first channel sidewalls of the third transistor, and wherein a ratio of a lateral thickness of the fourth layer to the first lateral thickness is greater than the ratio of a lateral thickness of the third layer to the first lateral thickness.

8. The device structure of claim 7, wherein a threshold voltage of the third transistor is at least 30% higher than a threshold voltage of the first transistor.

9. A system comprising:
a battery;
an antenna; and
a processor coupled to the antenna, wherein the processor includes the device structure of claim 1.

* * * * *